(12) United States Patent
Rasalingam et al.

(10) Patent No.: US 11,832,383 B1
(45) Date of Patent: Nov. 28, 2023

(54) SHARED VIAS FOR DIFFERENTIAL PAIR TRACE ROUTING

(71) Applicant: Western Digital Technologies, Inc., San Jose, CA (US)

(72) Inventors: Uthayarajan A/L Rasalingam, Nibong Tebal (MY); Hock Boon Khaw, Seberang Perai (MY)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/864,101

(22) Filed: Jul. 13, 2022

(51) Int. Cl.
*H05K 1/02* (2006.01)

(52) U.S. Cl.
CPC ......... *H05K 1/0245* (2013.01); *H05K 1/0251* (2013.01); *H05K 2201/09236* (2013.01); *H05K 2201/10159* (2013.01)

(58) Field of Classification Search
CPC ............................ H05K 1/0245; H05K 1/0251
See application file for complete search history.

(56) References Cited

U.S. PATENT DOCUMENTS

| 10,852,762 | B2 | 12/2020 | Maroney |
| 2011/0019372 | A1 | 1/2011 | Teck Kheng |
| 2013/0327565 | A1 | 12/2013 | Qu |

FOREIGN PATENT DOCUMENTS

| JP | 2020035839 A | 3/2020 |
| KR | 20070013088 A | 1/2007 |
| KR | 20190072090 A | 6/2019 |

OTHER PUBLICATIONS

International Search Report and Written Opinion mailed in PCT Application No. PCT/US2023/024094 dated Sep. 20, 2023 (10 pages).

*Primary Examiner* — Jeremy C Norris
(74) *Attorney, Agent, or Firm* — Michael Best & Friedrich LLP (57) ABSTRACT

Multi-signal vias for use with differential pair signals in electronic devices. The electronic devices include a printed circuit board having a first side and a second side opposite the first side, a first conductive trace on the first side of the substrate and a second conductive trace on the first side of the substrate. The printed circuit board also includes a shared via, which includes a first conductive portion and a second conductive portion. The first conductive portion and the second conductive portion are separated by a non-conductive portion. The first conducive trace is coupled to the first conductive portion of the shared via and the second conductive trace is coupled to the second conductive portion of the shared via.

20 Claims, 7 Drawing Sheets

SHARED VIAS FOR DIFFERENTIAL PAIR TRACE ROUTING

BACKGROUND

This application relates generally to signal trace routing within an electronic device, and more specifically, to an electronic device utilizing shared vias to aid in maintaining similar trace lengths for differential pair signals within a multi-layer printed circuit board ("PCB") arrangement.

Electronic devices, such as solid-state memory devices ("SSDs") generally send and receive data to an external electronic device. While various communication types may be used to interface between the electronic devices, differential pair signals are often used due to their advantages in data transfers between devices, such as common-mode noise reduction, high-speed noise reduction, low crosstalk, ground offset immunity, etc. However, differential pair signals must be carefully routed using a pair of traces within a PCB of an electronic device to maximize the benefits.

One specific design requirement is that each trace of differential pair traces must have similar lengths to ensure proper impedance between the traces to maintain optimal operation. However, maintaining similar lengths of differential pair traces may be difficult in complex PCB designs where the traces may be required to be routed across different layers of the PCB. Common trace routing generally use a via for each trace of the differential pair signal, which can result in different paths being taken by each trace of the differential pair. This can result in one trace having to be specially routed to ensure the length of each of the traces is substantially the same, thereby requiring additional space on the PCB, as well as increasing the complexity of the PCB design.

SUMMARY

Maintaining equal lengths between differential pair traces within an electronic device, such as a data storage device, may be difficult due to the complex nature of the PCB design, particularly where the differential pair traces are required to traverse multiple layers of the PCB. By using a via that is shared (referred to herein as a "shared via") for each signal within a differential pair signal, length differences caused by traversing layers of the PCB may be reduced, thereby decreasing PCB board design complexity and maximizing space within the PCB itself.

In one embodiment, a printed circuit board for an electronic device is described, according to some embodiments. The printed circuit board includes a substrate having a first side and a second side opposite the first side, a first conductive trace on the first side of the substrate and a second conductive trace on the first side of the substrate. The printed circuit board also includes a shared via, which includes a first conductive portion and a second conductive portion. The first conductive portion and the second conductive portion are separated by a non-conductive portion. The first conducive trace is coupled to the first conductive portion of the shared via and the second conductive trace is coupled to the second conductive portion of the shared via.

In another embodiment a data storage device is described, according to some embodiments. The data storage device includes a substrate having a first side and a second side opposite the first side, and a pair of conductive traces on the first side of the substrate. The pair of conductive traces include a positive signal trace for conducting a positive signal of a differential pair and a negative signal trace for conducting a negative signal of the differential pair. The data storage device further includes a shared via on the first side of the substrate, including a first conductive portion and a second conductive portion, wherein the first conductive portion and the second conductive portion are separated by a non-conductive portion. The positive signal trace is coupled to the first conductive portion of the shared via and the negative signal trace is coupled to the second conductive portion of the shared via.

In another embodiment, an electronic assembly is described. The electronic assembly includes a printed circuit board including a controller on a first side of the printed circuit board. The electronic assembly further includes a set of differential signal traces configured to communicate a differential signal between an external device and the controller. The set of differential signal traces include a positive signal trace and a negative signal trace. The electronic assembly further includes at least one shared via on a first layer of the printed circuit board forming a first conductive path and a second conductive path to a second layer of the printed circuit board. The shared via includes a first conductive portion and a second conductive portion separated by a non-conductive portion. The positive signal trace is coupled to the first conductive portion of the shared via and the negative signal trace is coupled to the second conductive portion of the shared via.

Various aspects of the present disclosure provide for improvements in memory and/or other electrical devices. For example, decreasing required space for differential pair trace routing can allow for further increases in component density within a given device package. The present disclosure can be embodied in various forms. The foregoing summary is intended solely to give a general idea of various aspects of the present disclosure and does not limit the scope of the present disclosure in any way.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc. Those of skill in the art also will realize that although the disclosure refers to a substrate used in a data storage device, the disclosure may apply to substrates used in other types of electronic devices. The disclosure applies to both substrates and printed circuit boards used in electronic devices. Further, although specific examples disclose memory devices, it will be understood by those of skill in the art that the inventive concepts disclosed herein may be applied to other types of electronic devices that are assembled using a printed circuit board.

Figure 1:
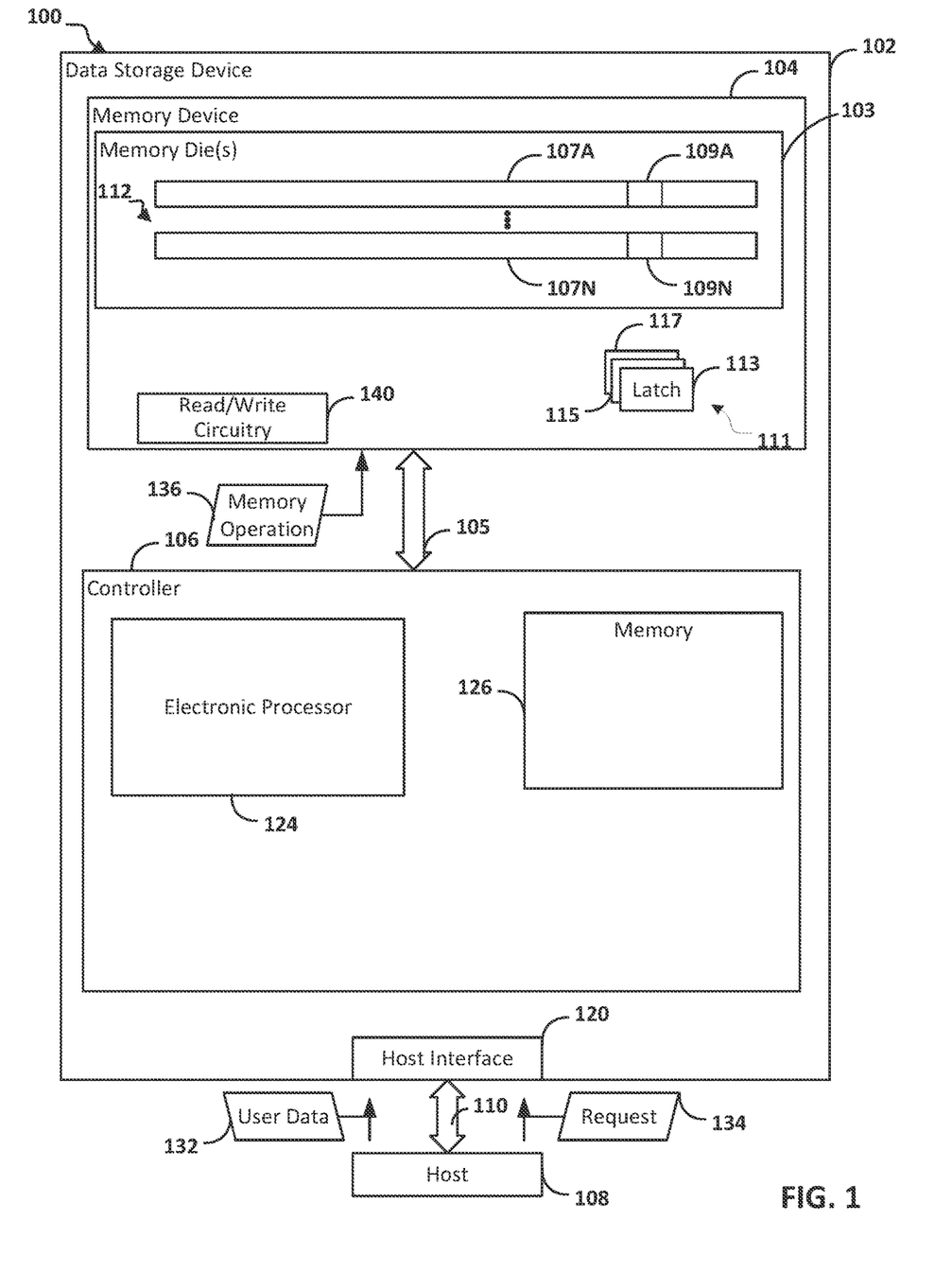
FIG. 1 is block diagram of one example of a system including a data storage device, according to some embodiments.

FIG. 1 is a block diagram of one example of a system 100 that includes a data storage device 102 in communication with a host device 108. The data storage device 102 includes a memory device 104 (e.g., non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled with a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In other examples, the data storage device 102 may be removably coupled to the host device 108 in accordance with a peripheral component interconnect express ("PCIE") configuration. In some implementations, the data storage device 102 may include or correspond to an SSD, which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 with the communication path 110, such as a wired communication path and/or a wireless communication path. For example, the data storage device 102 may include an interface 120 (e.g., a host interface) that enables communication with the communication path 110 between the data storage device 102 and the host device 108, such as when the interface 120 is communicatively coupled to the host device 108. However, other communication paths are contemplated as required for a given application. In some embodiments, the communication path 110 may include one or more electrical signal contact pads or fingers that provide electrical communication between the data storage device 102 and the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data 134 to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates with a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification, a PCIE specification, or other suitable industry specification as required for a given application. The host device 108 may also communicate with the memory device 104 in accordance with any other suitable communication protocols.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140 to support operation of the one or more memory dies 103. Although depicted as a single component, the read/write circuitry 140 may be divided into separate components of the memory device 104, such as read circuitry and write circuitry. The read/write circuitry 140 may be external to the one or more memory dies 103 of the memory devices 104. Alternatively, one or more individual memory dies may include corresponding read/write circuitry that is operable to read from and/or write to storage elements within the individual memory die independent of any other read and/or write operations at any of the other memory dies.

The controller 106 is coupled to the memory device 104 (e.g., the one or more memory dies 103) with a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 with the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a memory 126, and another associated circuitry. The memory 126 may be configured to store data and/or instructions that may be executable by the processor 124.

The controller 106 may send the memory operation 136 (e.g., a read command) to the memory device 104 to cause the read/write circuitry 140 to sense data stored in a storage element. For example, the controller 106 may send the read command to the memory device 104 in response to receiving a request for read access from the host device 108. In response to receiving the read command, the memory device 104 may sense the storage element 107A (e.g., using the read/write circuitry 140) to generate one or more sets of bits representing the stored data.

Generally, one or more components of the data storage device 102, such as the memory devices 104 and/or the controller 106 are solid-state integrated circuit packages. These packages are coupled to a PCB or other applicable substrates. Often a grid array component is used to maximize the connection points between the package and the substrate.

Figure 2:
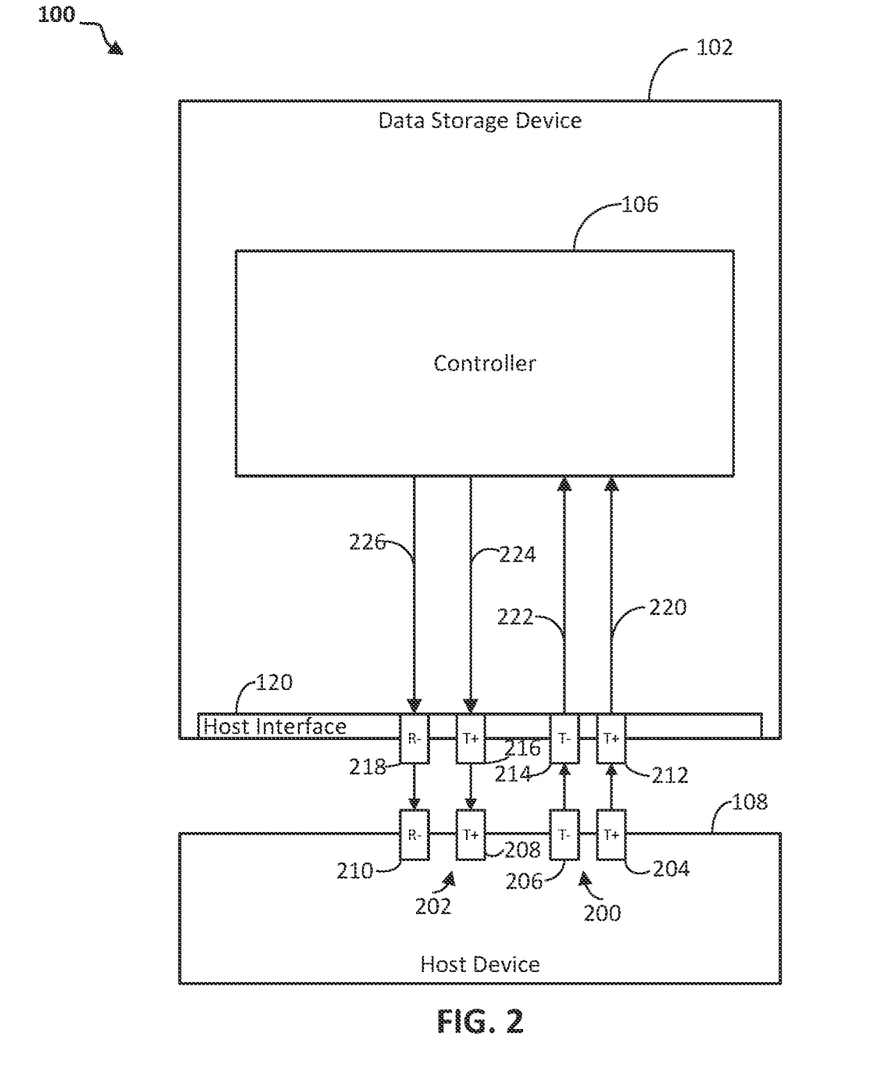
FIG. 2 is a simplified block diagram of the data storage device of FIG. 1, according to some embodiments.

Turning now to FIG. 2, a simplified block diagram of the memory system 100 is shown, according to some embodiments. The host device 108 includes a transmission differential pair 200 and a receive differential pair 202 for communicating with the data storage device 102. The transmission differential pair 200 may be coupled to a positive output terminal 204 and a negative output terminal 206. Similarly, the receive differential pair 202 may be coupled to a positive input terminal 208 and a negative input terminal 210. In one example, the output terminals 204, 206, and the input terminals 208, 210 are compatible with a PCIE communication protocol. However, other communication protocols are contemplated, as required for a given application.

The positive output terminal 204 may be coupled to a corresponding positive input terminal 212 of the host interface 120, and the negative output terminal 206 may be coupled to a corresponding negative input terminals 214 of the host interface 120. Similarly, the positive input terminal 208 may be coupled to a positive output terminal 216 of the host device 108, and the negative input terminal 210 may be coupled to a negative output terminal 218 of the host device 108.

The differential pairs 200, 202 may be transmitted to the controller 106 using differential pair traces to couple the host interface 108 to the controller 106. For example, a positive receiving trace 220 and a negative receiving trace 222 may couple the controller 106 to the positive input terminal 212 and the negative input terminal 214 of the host interface 120, respectively. Similarly, a positive transmission trace 224 and a negative transmission trace 226 may couple the controller 106 to the positive output terminal 216 and the negative output terminal 218 of the host interface 120, respectively. The configuration shown in FIG. 2 is for example purposes, and it is understood that the host interface 120 and the host device 108 may be configured to allow for more than two differential signals to be simultaneously communicated between them, as required for a given application.

Figure 3:
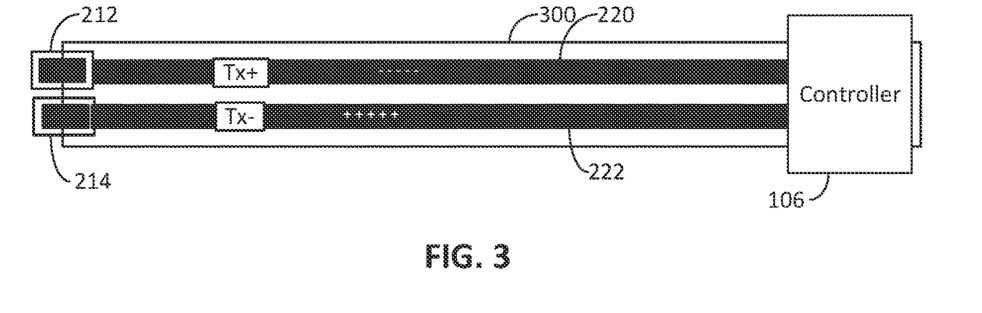
FIG. 3 is a top view of a pair of differential traces on a printed circuit board, according to some embodiments.

Turning now to FIG. 3, an example of an ideal routing of differential pair traces is shown, according to some embodiments. With reference to FIG. 2, a differential signal may be applied to the positive input terminal 212 and the negative input terminal 214 of the host interface 120. While described with reference to the input terminals 212, 214, it is understood that the example of FIG. 3 could apply to any differential signal communication between a host device and an electronic device. As shown in FIG. 3, the differential signal traces 220, 222 are routed in a straight line on a PCB 300, and are of equal length, thereby making them ideal for differential signal transmission. However, due to the density of components and traces within modern electronic devices, including memory devices, it is often not feasible to achieve the short, equal length differential signal traces 220, 222 as shown in FIG. 3. Often, the differential signal traces 220, 222 may be routed around components or across layers of the PCB 300 to avoid other components/traces, as well as to be within design parameters of a given device.

Figure 4:
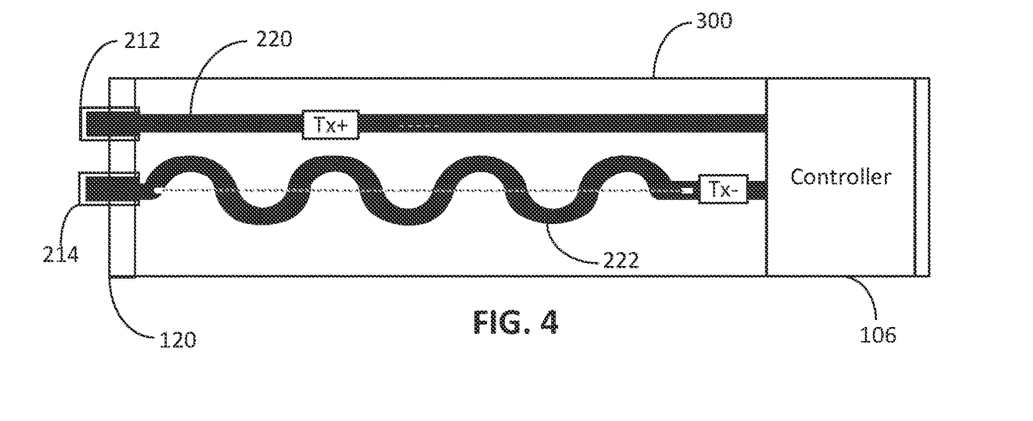
FIG. 4 is a top view of a modified pair of differential trace on the printed circuit board of FIG. 3, according to some embodiments.

Turning now to FIG. 4, an example of a non-ideal routing of differential pair traces is shown, according to some embodiments. With reference again to FIG. 2, a differential signal may be applied to the positive input terminal 212 and the negative input terminal 214 of the host interface 120. While described with reference to the input terminals 212, 214, it is understood that the example of FIG. 4 could apply to any differential signal communication between a host device and an electronic device. As shown in FIG. 4, the differential signal traces 220, 222 are routed in separate configurations. Specifically, the positive receiving trace 220 is routed in a straight line to the controller 106, while the negative receiving trace 222 is routed to the controller 106 in a serpentine configuration. As described in more detail below, the serpentine configuration may be used to ensure that the length of the negative receiving trace 222 is the same as the positive receiving trace 220. This may be required where routing of the positive receiving trace 220 causes the receiving trace 222 to be longer than the negative receiving trace 222, as will be described in more detail below. The examples described herein with respect to the positive receiving trace 220 and the negative receiving trace 222 are for example purposes only, and it is contemplated that various differential signal traces may be used interchangeably as required for given application.

Figure 5:
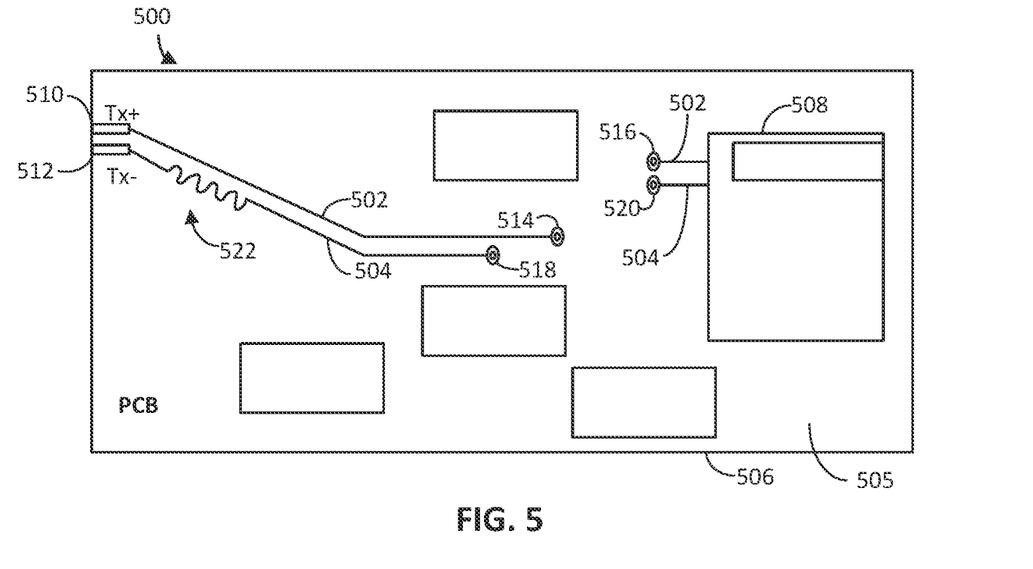
FIG. 5 is top view of a printed circuit board of an electronic device, according to some embodiments.

Turning now to FIG. 5, an example routing of a pair of differential signal traces within an electronic device 500, such as a positive transmission trace 502 and a negative transmission trace 504, is shown according to some embodiments. While described with respect to positive and negative transmission traces, it is contemplated that the example of FIG. 5 also applies to receiving differential pair traces, and that the electronic device 500 may include multiple differential signal traces. The positive transmission trace 502 and the negative transmission trace 504 are both located on a top layer 505 of PCB 506. As shown in FIG. 5, the positive transmission trace 502 and the negative transmission trace 504 are used to couple a controller 508 to a positive output trace 510 and a negative output trace 512, respectively, which in turn may be in communication with an external device, such as a host device described above. In one embodiment, the electronic device 500 may be a data storage device, such as data storage device 102 described above. However, other devices, such as smartphones, computers, tablets, or other electronic devices are also contemplated. Further, the controller 508 may be similar to the controller 106 described above.

The positive transmission trace 502 is shown as routed to a first via 514, which in turn allows the positive transmission trace 502 to traverse to a subsequent layer of the PCB 506. The positive transmission trace 502 then traverses back to the top layer 505 of the PCB 506 using a second via 516, at which point the positive transmission trace 502 is coupled to the controller 508. Similarly, the negative transmission trace 504 is routed to a third via 518, which in turn allows the negative transmission trace 504 to traverse to a subsequent layer of the PCB 506. The negative transmission trace 504 then traverses back to the top layer 505 of the PCB 506 using a fourth via 520. As shown in FIG. 5, the first via 514 and the third via 518 are offset from each other by a distance. This offset may be required due to avoid components or other traces on other layers of the PCB 506. Further, while not shown, routing of the positive transmission trace 502 may force the positive transmission trace 502 to take a longer path to the second via 516 than the negative transmission trace 504 is required to take to the fourth via 520. This may result in the positive transmission trace 502 having a greater length than the negative transmission trace 504, which can lead to decoupling or other issues with the differential signals being transmitted over the positive transmission trace 502 and the negative transmission trace 504.

In order to ensure that the positive transmission trace 502 and the negative transmission trace 504 have a substantially equal length (e.g., within +/−5%), a lengthening portion 522 is added to the negative transmission trace 504 to increase the length of the negative transmission trace 504. While shown as a serpentine shape in FIG. 5, it is understood that various other configurations may be used within the lengthening portion 522 as required for a given application. As shown in FIG. 5, the lengthening portion 522 requires additional space on the PCB 506, which may otherwise be used for component and/or trace placement.

Figure 6A:
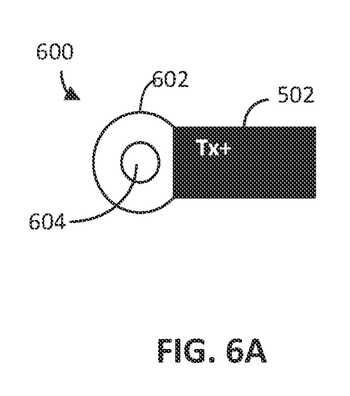
FIGS. 6A-6B are top and perspective views of a via of the electronic device of FIG. 5, according to some embodiments.
Figure 6B:
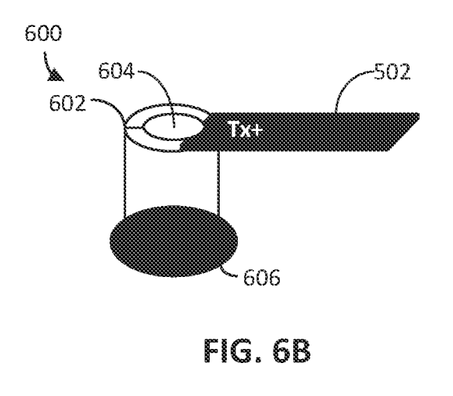

Turning now to FIGS. 6A-6B, an example layout of a via 600, such as first via 514 is shown according to some embodiments. While described with respect to the first via 514, it is understood that the example layout of FIGS. 6A-6B may apply to any via described with respect to FIG. 5. The via 600 is shown coupled to a portion of the positive transmission trace 502 via a conductive portion 602 of the via 600. The via 600 may have an aperture 604 surrounded by the conductive portion 602. In one embodiment, the aperture 604 is an opening within a PCB, such as PCB 506. In other examples, the aperture 604 may be constructed of a non-conductive material, such as a PCB substrate, or other non-conductive material. As shown in FIG. 6B, the conductive portion 602 may extend longitudinally such that the conductive portion 602 extends through one or more layers of a PCB, such as PCB 506. The conductive portion 602 may terminate at a conductive end 606, which may be on a different layer of the PCB than the positive transmission trace 502.

As shown in FIGS. 6A-6B, the conductive portion 602 defines the aperture 604 such that only a single electrical connection (e.g., a common signal) may be coupled to the via 600, thereby requiring a separate via for every signal trace that is required to traverse across layers of a PCB.

In order to help maintain equality in length between differential pair traces, a shared via is described below, which allows for both differential pair signals to be routed to a single via when the respective signal traces are required to traverse layers of a PCB. The use of a shared via is described in detail below.

Figure 7:
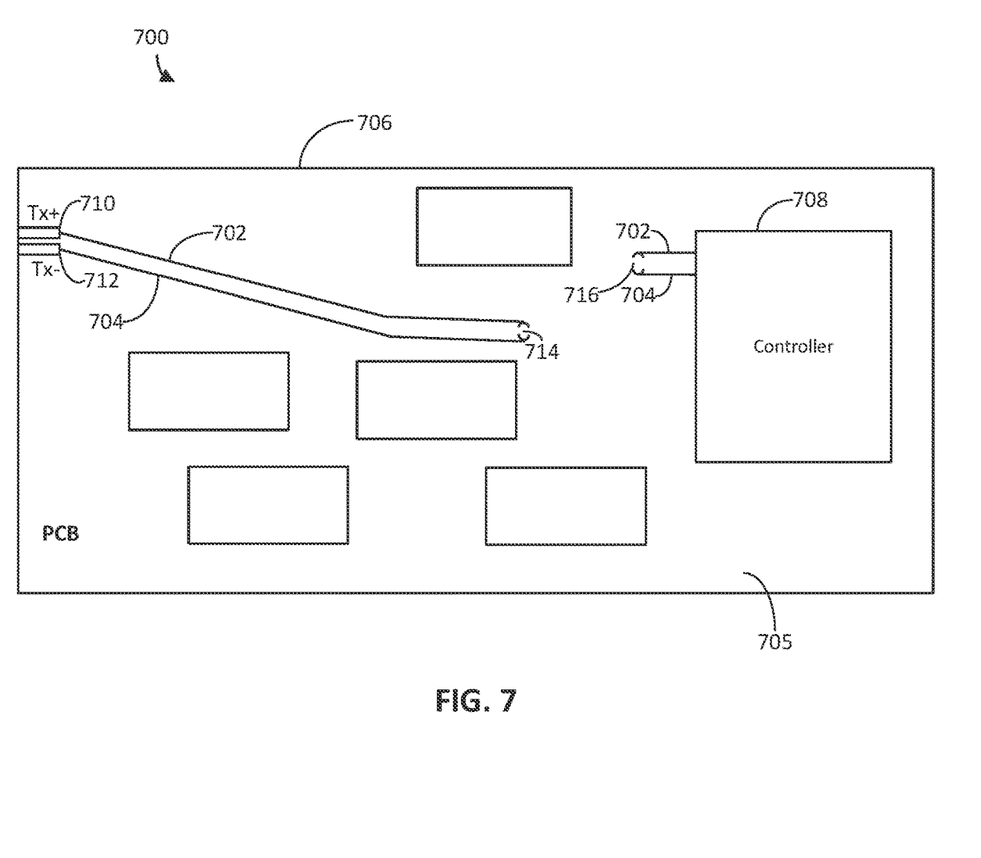
FIG. 7 is a top view of a printed circuit board using shared vias, according to some embodiments.

Turning now to FIG. 7, a modified routing of a differential pair of traces within an electronic device 700, such as a positive transmission trace 702 and a negative transmission trace 704 described above, is shown according to some embodiments. While described with respect to positive and negative transmission traces, it is contemplated that the example of FIG. 7 also applies to receiving differential pair traces, and that the electronic device 700 may include multiple differential signal traces. The positive transmission trace 702 and the negative transmission trace 704 are both shown on a top layer 705 of a PCB 706. As shown in FIG. 7, the positive transmission trace 702 and the negative transmission trace 704 are used to couple a controller 708 to a positive output terminal 710 and a negative output terminal 712, respectively, which in turn may be in communication with an external device, such as a host device described above. In one embodiment, the electronic device 700 may be a data storage device, such as data storage device 102 described above. However, other devices may utilize shared vias, such as smartphones, computers, tablets, or other electronic devices to improve differential signal trace routing. Further, the controller 708 may be similar to the controller 106 described above.

The positive transmission trace 702 is shown as routed to a first shared via 714, which in turn allows the positive transmission trace 702 to traverse to a different layer of the PCB 706. The positive transmission trace 702 then traverses back to the top layer 705 of the PCB 706 using a second shared via 716, at which point the positive transmission trace 702 is coupled to the controller 708. The negative transmission trace 704 is also routed to the first shared via 714, which in turn allows the negative transmission trace 704 to traverse to a subsequent layer of the PCB 706. The negative transmission trace 704 then traverses back to the top layer 705 of the PCB 706 using the second shared via 716. As both the positive transmission trace 702 and the negative transmission trace 704 use shared vias 714, 716, the substantially equal length between the positive transmission trace 702 and the negative transmission trace 704. This can eliminate the need to lengthen one trace of a differential trace pair, such as by including a lengthening portion as described above. This increases the available space on the PCB 706 for other components and/or traces. While the example of FIG. 7 describes a PCB 706 having a first shared via 714 and a second shared via 716, it is understood that in some examples, there may be only a single shared via traversing between layers of the PCB 706. In other examples, there may be more than two shared via to traverse between various layers of the PCB 706.

Figure 8A:
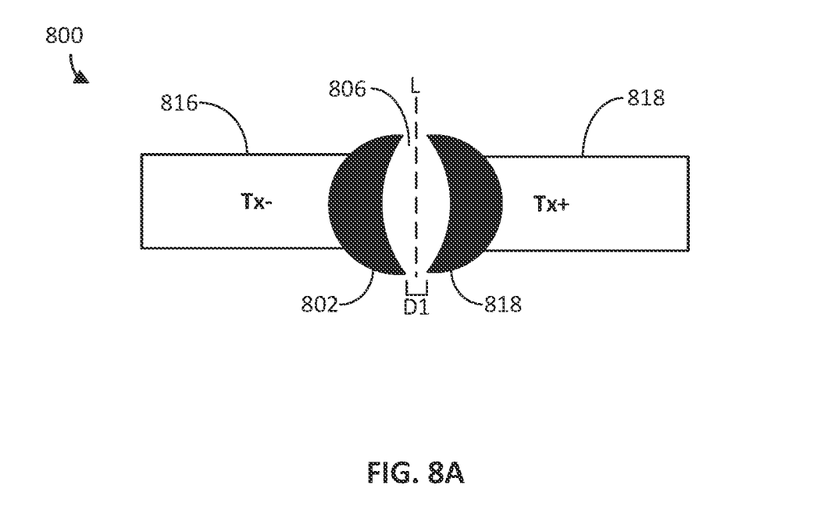
FIGS. 8A-8B are top and perspective views of the shared vias of FIG. 7, according to some embodiments.
Figure 8B:
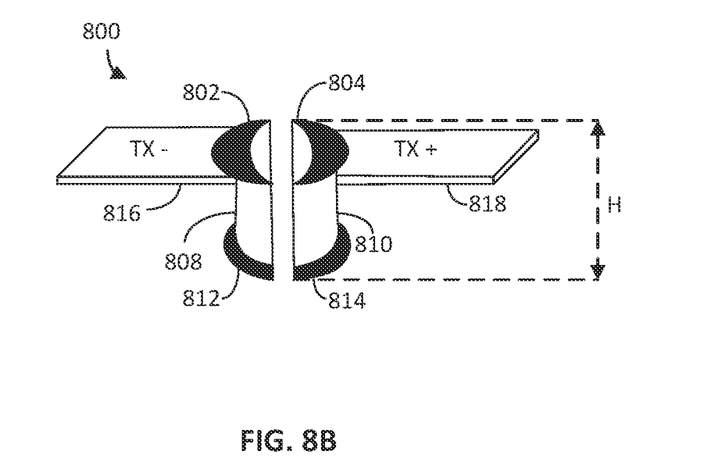

Turning now to FIGS. 8A-8B, a magnified view of a shared via 800 is shown, according to some embodiments. The shared via 800 may be similar to the shared vias 714, 716 described above. The shared via 800 include a first conductive portion 802 and a second conductive portion 804, which are separated by a non-conductive portion 806. In one embodiment, the first conductive portion 802 and the second conductive portion 804 are generally crescent shaped, which may also be referred to as "kidney" shaped. However, other shapes, such as semi-circular, rectangular, trapezoidal, or the like are also contemplated, as required for a given application. The first conductive portion 802 and the second conductive portion 804 may be made of various conductive materials, such as copper, gold, silver, or other material as required for a given application. In some examples, first conductive portion 802 and the second conductive portion 804 may be copper and have an additional coating (not shown), such as gold or silver. However, other materials are also contemplated as required for a given application. In some examples, a non-conductive coating (not shown) may be applied to all or part of the first conductive portion 802 and the second conductive portion 804, such as an epoxy or other material to reduce or prevent corrosion or contamination of the shared via 800. For example, the non-conductive coating may aid in preventing conductive debris from forming a short across the non-conductive portion 806.

The first conductive portion 802 and the second conductive portion 804 may be separated by a minimum distance D1 of the non-conductive portion 806, which is required to prevent crosstalk or shorting between the first conductive portion 802 and the second conductive portion 804. In one embodiment, the distance D1 is approximately 5 nm. However, distances of more than 5 nm or less than 5 nm are also contemplated. In some embodiments, the distance D1 is sized to provide a minimum impedance between the first conductive portion 802 and the second conductive portion 804. In one embodiment, the minimum impedance is 1 MΩ. However, values of more than 1 MΩ or less than 1 MΩ are also contemplated.

In one embodiment, the non-conductive portion 806 is an air gap, (e.g., an aperture or other separation of the first conductive portion 802 and the second conductive portion 804 that is filled with atmospheric air). However, in other embodiments, the non-conductive portion 806 may include a di-electric material, such as the PCB substrate material. In still other examples, the non-conductive portion 806 may be an aperture (or other separation) that is then filled with a non-conductive material, such as a resin, epoxy, or other material as required for a given application. It is further contemplated that other materials, including combinations of the above noted materials may be used to form the non-conductive portion 806, as required for a given application.

As shown in FIG. 8B, the first conductive portion 802 includes a first conductive member 808 extending longitudinally. Similarly, the second conductive portion 804 includes a second conductive member 810 extending longitudinally. The non-conductive portion 806 further extends longitudinally along an entire height H of the shared via 800. The first conductive member 808 and the second conductive member 810 are configured to provide a conductive path between layers of a PCB. The first conductive member 808 may terminate at a third conductive portion 812, and the second conductive member 810 may terminate at a fourth conductive portion 814. The third conductive portion 812 and the fourth conductive portion 814 may be similar to the first conductive portion 802 and the second conductive portion 804 but located on a different layer of a PCB.

As shown in FIGS. 8A-8B, a trace may be coupled to each of the first conductive portion 802 and the second conductive portion 804. In one embodiment, the traces are different polarities of a differential pair. For example, as shown in FIGS. 8A-8B, a negative transmission trace 816 is coupled to the first conductive portion 802 and a positive transmission trace is coupled to the second conductive portion 804. However, it is understood that positive and negative receiving traces may also be used in conjunction with the shared via 800. As shown in FIGS. 8A-8B, the negative transmission trace 816 and the positive transmission trace 818 are coupled to the first conductive portion 802 and the second conductive portion 804 in a direction substantially perpendicular to a length L of the shared via 800. However, other configurations are also contemplated.

Figure 9A:
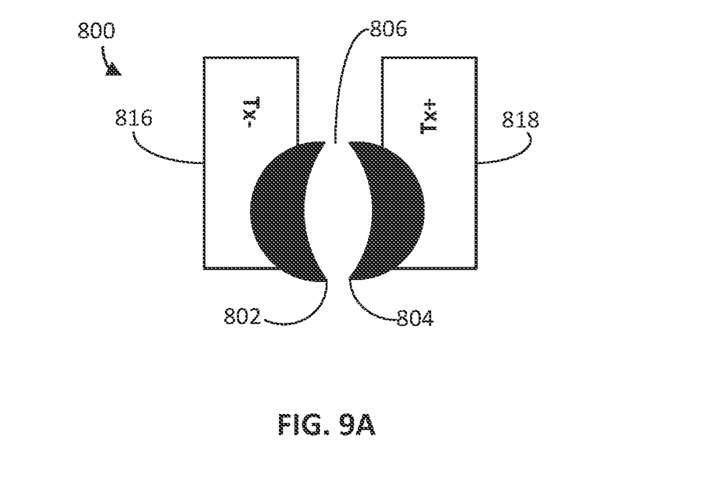
FIGS. 9A-9B are top and perspective views of the shared vias of FIG. 7 with an alternate connection arrangement, according to some embodiments.
Figure 9B:
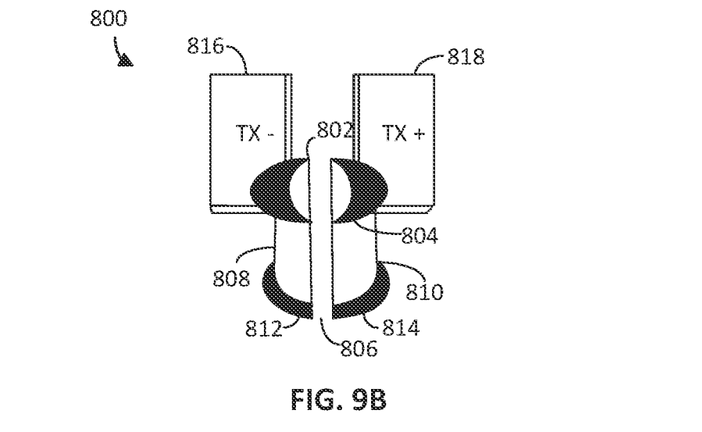

For example, as shown in FIGS. 9A-9B, the negative transmission trace 816 and the positive transmission trace 818 may be coupled to the first conductive portion 802 and the second conductive portion 804, respectively, in a direction substantially parallel to the length L of the shared via 800. It is contemplated that the negative transmission trace 816 and the positive transmission trace 818 may be coupled to the first conductive portion 802 and the second conductive portion 804, respectively, in other configurations and angles, and the above examples are for illustrative purposes only.

While not shown, it is understood that corresponding traces may be coupled to the third conductive portion 812 and the fourth conductive portion 814 such that the traces may be routed on another layer of a PCB. These additional traces may be coupled to the respective third conductive portion 812 and the fourth conductive portion 814 in the same or a different orientation than the negative transmission trace 816 and the positive transmission trace 818.

The above shared via designs allow for differential signal traces to be routed to the same via location on a PCB, thereby maintaining similar lengths between the respective traces, as is required for differential signal transmissions. In addition to allowing for simplification of PCB design, the use of a shared via allows for more effective use of space on a given PCB, thereby allowing for greater component density.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A printed circuit board for an electronic device, comprising:
   a substrate having a first side and a second side opposite to the first side;
   a first conductive trace on the first side of the substrate;
   a second conductive trace on the first side of the substrate; and
   a shared via, including a first conductive portion and a second conductive portion, wherein the first conductive portion and the second conductive portion are separated by a non-conductive portion,
   wherein the first conductive trace is coupled to the first conductive portion of the shared via and the second conductive trace is coupled to the second conductive portion of the shared via.

2. The printed circuit board of claim 1, wherein the first conductive portion and the second conductive portion are crescent shaped.

3. The printed circuit board of claim 1, wherein the first conductive trace and the second conductive trace are differential pair traces.

4. The printed circuit board of claim 1, wherein the non-conductive portion separates the first conductive portion and the second conductive portion by a minimum distance.

5. The printed circuit board of claim 4, wherein the minimum distance is 5 nm.

6. The printed circuit board of claim 1, wherein the minimum distance is configured to provide an impedance of at least 1 MΩ between the first conductive portion and the second conductive portion.

7. The printed circuit board of claim 1, wherein the non-conductive portion is an aperture filled with a non-conductive material.

8. A data storage device, comprising:
   a substrate having a first side and a second side opposite to the first side;
   a pair of conductive traces on the first side of the substrate, including:
      a positive signal trace for conducting a positive signal of a differential pair; and
      a negative signal trace for conducting a negative signal of the differential pair; and
   a shared via on the first side of the substrate, including a first conductive portion and a second conductive portion, wherein the first conductive portion and the second conductive portion are separated by a non-conductive portion,
   wherein the positive signal trace is coupled to the first conductive portion of the shared via and the negative signal trace is coupled to the second conductive portion of the shared via.

9. The data storage device of claim 8, wherein the first conductive portion and the second conductive portion are crescent shaped.

10. The data storage device of claim 8, wherein the non-conductive portion separates the first conductive portion and the second conductive portion by a minimum distance.

11. The data storage device of claim 10, wherein the minimum distance provides at least 1 MΩ of impedance between the first conductive portion and the second conductive portion.

12. The data storage device of claim 8, wherein the non-conductive portion continues along an entire height of the shared via.

13. The data storage device of claim 8, wherein the positive signal trace and the negative signal trace are oriented parallel to a length of the shared via.

14. The data storage device of claim 8, wherein the positive signal trace and the negative signal trace are oriented perpendicular to a length of the shared via.

15. An electronic assembly, comprising:
   a printed circuit board including a controller on a first side of the printed circuit board;
   a set of differential signal traces configured to communicate a differential signal between an external device and the controller, the set of differential signal traces include a positive signal trace and a negative signal trace; and
   at least one shared via on a first layer of the of the printed circuit board forming a first conductive path and a second conductive path to a second layer of the printed circuit board,
   wherein the shared via includes a first conductive portion forming the first conductive path and a second conductive portion forming the second conductive path, wherein the first conductive portion and the second conductive portion are separated by a non-conductive portion,
   wherein the positive signal trace is coupled to the first conductive portion of the shared via and the negative signal trace is coupled to the second conductive portion of the shared via.

16. The electronic assembly of claim 15, wherein the positive signal trace and the negative signal trace are oriented parallel to a length of the shared via.

17. The electronic assembly of claim 15, wherein the positive signal trace and the negative signal trace are oriented perpendicular to a length of the shared via.

18. The electronic assembly of claim 15, wherein the first conductive portion and the second conductive portion are crescent shaped.

19. The electronic assembly of claim 15, wherein the non-conductive portion separates the first conductive portion and the second conductive portion by a minimum distance.

20. The electronic assembly of claim 19, wherein the minimum distance provides at least 1 MΩ of impedance between the first conductive portion and the second conductive portion.

\* \* \* \* \*